United States Patent

[11] 3,634,702

[72] Inventor Karsten E. Drangeid Hedingen, Switzerland
[21] Appl. No. 884,527
[22] Filed Dec. 12, 1969
[45] Patented Jan. 11, 1972
[73] Assignee International Business Machines Corporation Armonk, N.Y.
[32] Priority Dec. 20, 1968
[33] Switzerland
[31] 19095/68

[54] SOLID-STATE DELAY LINE
10 Claims, 5 Drawing Figs.

[52] U.S. Cl. .......... 307/299, 307/304, 317/235 (21.1), 317/235 (31), 317/235 (39), 333/31
[51] Int. Cl. .......... H01l 11/00, H01l 11/14
[50] Field of Search .......... 317/234, 235; 307/299, 304; 333/31

[56] References Cited

UNITED STATES PATENTS

| | | | |
|---|---|---|---|
| 2,984,752 | 5/1961 | Giacoletto | 317/235 |
| 3,328,601 | 6/1967 | Rosenbaum | 317/235 |
| 3,333,115 | 7/1967 | Kawakam | 317/235 |
| 3,449,645 | 6/1969 | Muller | 317/235 |

*Primary Examiner*—Jerry D. Craig
*Attorneys*—Hanifin and Jancin and Bernard N. Wiener

ABSTRACT: A solid-state delay line is disclosed which includes a field effect transistor with a gate electrode which is considerably extended in the direction of the semiconductor current channel. Two DC voltage sources are connected to the source and drain electrodes and to the ends of the gate electrode, respectively, and cause currents to be adjusted such that the voltage drops per unit length in the semiconductor channel and in the gate electrode are equal. A uniform thickness of the charge carrier variation zone, i.e., a depletion zone or an enhancement zone, is obtained in the semiconductor channel and the delay of signals propagating through the semiconductor channel is proportional to the length of the extended gate electrode.

INVENTOR
KARSTEN E. DRANGEID

BY Bernard N. Wiener
ATTORNEY

SOLID-STATE DELAY LINE

BACKGROUND OF THE INVENTION

Delay lines have application in different fields and particularly in communications. It is a basic problem to design a device which provides a sufficiently long delay without requiring costly hardware and without relying on elements such as inductances and capacitances which may be bulky. Particularly, the requirement for small dimensions of delay lines is very important in the practice of integrated circuit technologies.

Semiconductor devices for delaying electrical signals in which the finite drift velocity of the charge carriers in a semiconductor channel is used have been described in the prior art literature. Illustratively, such devices have been disclosed in U.S. Pat. Nos. 2,941,092; 3,192,398, and 3,200,354. However, all known devices make use of the drift velocity of minority carriers for which the lifetime is limited in a semiconductor channel. Therefore, only relatively short semiconductor channels with consequent delays can be realized according to the prior art. Further, the prior art devices have the disadvantage that the signals are strongly attenuated in the delay line whereby the maximum length of the delay line is also limited. For most applications, the signals have had to be regenerated after having passed through a prior art delay line.

SUMMARY OF THE INVENTION

It is the primary object of the present invention to provide a delay line with very small structure for delays of input signals which are relatively long and practically frequency independent, which are useful for integrated circuitry and which does not require inductances and capacitances except the natural capacitances of the semiconductor elements used.

A further object of this invention is to provide a semiconductor delay line to obtain a delay of electrical signals which utilizes the finite drift velocity of majority carriers in a semiconductor channel whose lifetime is considerably higher than that of minority carriers.

It is another object of the present invention to provide a delay line in which the signals propagating through the device remain unattenuated with the amplitude of the output signal being approximately equal to that of the input signal.

These objects are achieved for the practice of this invention by a delay line comprising a semiconductor channel provided with source, gate and drain electrodes, the source and drain electrodes are connected to a first DC voltage source and opposite ends of the gate electrode are connected to a second DC voltage source to cause a voltage drop along the length of the gate electrode so that an approximately uniform thickness of the depletion zone or the enhancement zone is obtained and the structure of the gate electrode is such as to provide for an equal or uniform AC potential over the whole length of the gate electrode.

The invention provides a solid-state delay line for electrical signals comprising a semiconductor channel forming a current path, the semiconductor layer being provided with source, gate and drain electrodes, the source and drain electrodes being connected to a direct voltage source. Within the semiconductor channel a charge carrier depletion zone or an enhancement zone is formed adjacent to the gate electrode. The thickness of the depletion zone is dependent on the voltage difference between neighboring points of the gate electrode and the semiconductor material bordering on the zone.

BRIEF DESCRIPTION OF THE DRAWINGS

The foregoing and other objects, features and advantages of the invention will become apparent from the following more particular description of preferred embodiments of the invention as illustrated in the accompanying drawings.

DESCRIPTION OF THE PREFERRED EMBODIMENTS

In order to describe the inventive delay line and in order to define the conditions to be met when building such devices as well as the advantages which can be obtained therefrom, a prior art field-effect transistor with a Schottky-barrier gate region will now be described with reference to FIG. 1.

In principle, a field-effect transistor is a variable resistor consisting of a semiconductor channel region whose resistance can be controlled by applied control voltages to obtain a continuous variation of the geometric dimensions or of the conductivity of the current channel. Illustratively, this is accomplished by removing practically all charge carriers within the region of the semiconductor channel close to the contact with the gate control electrode. The thickness of the depletion zone which reduces the cross-sectional area of the current path depends on the value of the gate control voltage. Assuming that a sufficiently thin semiconductor channel is used and that a sufficiently high control voltage is applied, the whole semiconductor channel is almost free of charge carriers and has a very high resistance.

Figure 1:
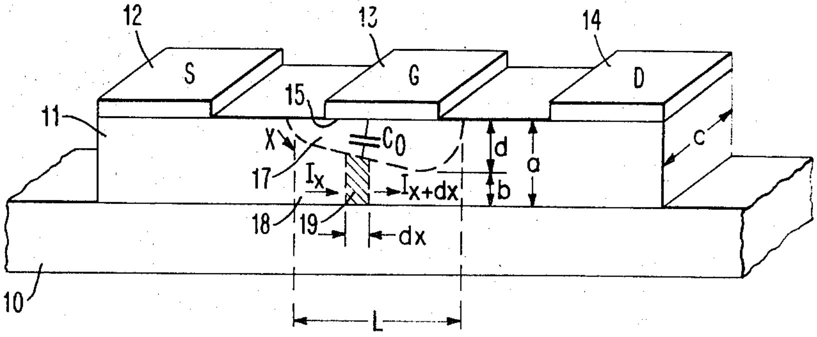
FIG. 1 is a schematic of a prior art field-effect transistor using a Schottky-barrier gate region.

The field-effect transistor shown schematically in FIG. 1 includes a semiconductor layer 11 arranged on an isolating substrate 10, e.g., an insulator material or a very high resistance semi-insulating semiconductor material. The conventional voltage sources and other circuitry are not shown. The semiconductor layer 11 may be of the N-type conductivity wherein the electrons serve as majority carriers. The semiconductor layer 11 is provided with three metal electrodes 12, 13 and 14 of which electrode 12 serves as source electrode S, electrode 13 serves as control or gate electrode G, and electrode 14 serves as drain electrode D. Electrodes S and D form ohmic contacts with the semiconductor layer 11. The metal of electrode G is chosen such that it causes the buildup of a Schottky-barrier within the contact region of the semiconductor layer 11 which acts as a diode. In the semiconductor region near the metal-semiconductor contact 15 electrode G, e.g., of gold, the concentration of free electrons, i.e., the concentration of charge carriers, is reduced by the order of several magnitudes compared to the concentration of free electrons in the semiconductor layer 11 remote from the contact 15.

As mentioned above, the thickness $d$ of the depletion zone 17 is controlled by the voltage applied to gate electrode G. The resistance for a current flowing in the semiconductor channel between electrodes S and D reaches its maximum value when $d$ equals $a$, i.e., the depletion zone extends through the whole semiconductor layer 11. The required gate control voltage is of such polarity that the metal-semiconductor diode is operated in its high-resistance direction and the control is practically nondissipative.

Due to the depletion zone 17, only the remaining cross section 18 of the semiconductor channel 11 serves as current path. For a current path element 19 (hatched area in FIG. 1) of length $dx$ (the boundary between the current path and the depletion zone 17 determines the $x$-direction), the current continuity has to be preserved. From this consideration there results the following equation:

$$\int(\Delta I_x-\Delta I_{x+dx})\cdot dt=\int\Delta I\cdot dt=\Delta Q\cdot dx$$

with:

$\Delta I_x$ = change of the current flowing into the path element 19 during time interval $dt$;

$\Delta I_{x+dx}$ = change of the current leaving the path element 19 during time interval $dt$;

$\Delta Q$ = space charge of the path element 19 per unit length.

Differentiation of this equation results in:

$$(d\Delta I/dx) = -(d\Delta Q/dt) \qquad (1)$$

For small changes in amplitude, higher order terms can be neglected and equation (1) develops into:

$$(d\Delta Q/dt) = jw\Delta Q$$

Therefore:

$$(d\Delta I/dx) = -jw\Delta Q \qquad (2)$$

or:

$$\Delta Q = -\frac{1}{jw}\cdot\frac{d\Delta I}{dx} \qquad (3)$$

Taking into account that $I = Q\cdot v$, wherein $v$ is the terminal velocity of the charge carriers in the semiconductor, a consideration of the DC condition results in:

$$I + \Delta I = (Q + \Delta Q)(v + \Delta v)$$
$$= Qv + \Delta Q\Delta v + \Delta Qv + Q\Delta v$$

For small amplitudes, the term $\Delta Q\Delta v$ can be neglected to obtain:

$$\Delta I = \Delta Qv + Q\Delta v \qquad (4)$$

Inserting (3) in equation (4) results in:

$$\Delta I = \frac{v}{jw}\cdot\frac{d\Delta I}{dx} + Q\Delta v \qquad (5)$$

By using the equations $\mu\cdot E = v$ and $Q\cdot\mu = (1/R_o)$, the following equation can be written:

$$Q\Delta v = Q\mu\cdot\Delta E$$
$$= (1/R_o)\cdot\Delta E \qquad (6)$$

with:

$\mu$ = mobility of charge carriers;

$E$ = electric field strength, $R_o$ = current path resistance, per unit length.

The following calculation is based on a semiconductor device of extension 1 cm. orthogonal to the current path $I_x$. The unit of $R_o$ is ohm/cm. and that of the capacity $C_o$ to be introduced below is farad/cm.

From (3) it follows that:

$$\Delta U = \frac{1}{C_0}\cdot\Delta Q = -\frac{1}{jwC_0}\cdot\frac{d\Delta I}{dx} \qquad (7)$$

with:

$C_o$ = capacity between gate electrode 13 and boundary of the depletion zone per unit length.

$\Delta U$ = change of voltage between the gate electrode 13 and the boundary of the depletion zone per unit length.

Because $\Delta E = -(d\Delta U/dx)$, equations (6) and (7) develop into:

$$Q\cdot\Delta v = \frac{1}{R_0}\cdot\frac{d}{dx}\left(\frac{1}{jwC_0}\cdot\frac{d\Delta I}{dx}\right) \qquad (8)$$

Inserting (8) into equation (5) results in:

$$\Delta I = -\frac{v}{jw}\cdot\frac{d\Delta I}{dx} + \frac{1}{R_0}\cdot\frac{d}{dx}\left(\frac{1}{jwC_0}\cdot\frac{d\Delta I}{dx}\right) \qquad (9)$$

The first term of the right-hand side of equation (9) corresponds to the equation of an undamped electrical wave processing in one direction on a transmission line. The second term of equation (9) corresponds to the equation of an RC-chain which becomes practically zero if $R_o$ is made very high; this condition can be fulfilled by either operating the current path in saturation or by making the thickness $b$ of the current path very small.

The statement of equation (9) serves as a basis for describing the nature and operation of the solid-state delay line provided for the practice of this invention. When the condition can be met for the delay line that the second term of the equation (9) is zero or that it is at least neglectably small, the delay $\tau$ for such a structure is independent of the frequency of the applied signal and is defined by the following equation:

$$\tau = (L/v) \qquad (10)$$

with:

$\tau$ = delay time;

$L$ = length of the current path for which $R_o$ infinite;

$v$ = drift velocity of charge carriers.

Under normal operating conditions, the depletion zone 17 of a Schottky-barrier field-effect transistor extends approximately beneath the gate electrode as shown in FIG. 1. Its thickness $d$ depends on the voltage difference between adjacent points of the gate electrode 13 and the semiconductor current path 18. This voltage difference is not constant over the length of the gate electrode 15 in the direction of current flow in the semiconductor 11 when the gate electrode exhibits the same DC potential at each point, while the current flowing in the current path causes a voltage drop within the semiconductor 11. The current channel becomes narrower towards the drain electrode 14. For a conventional field effect transistor, the condition that the resistance $R_o$ of the semiconductor current channel must be approximately equal and practically infinitely high within the whole region of the depletion zone cannot be met.

Figure 2A:
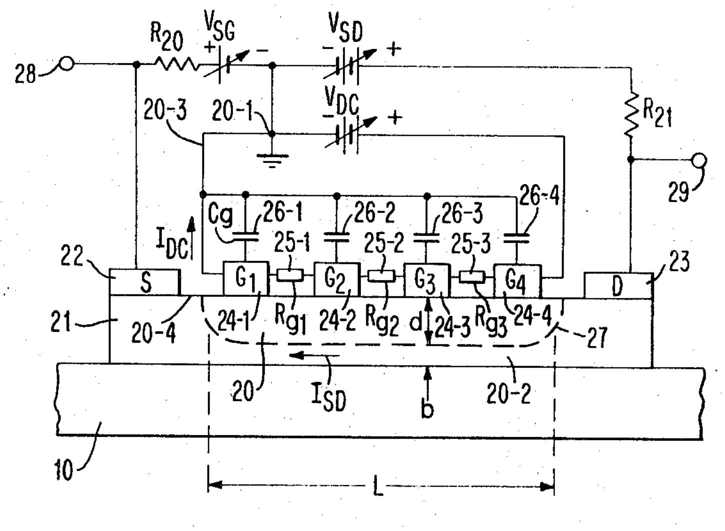
FIG. 2A is a partially schematic representation of an embodiment of this invention illustrating the principle of the inventive delay line.
Figure 2B:
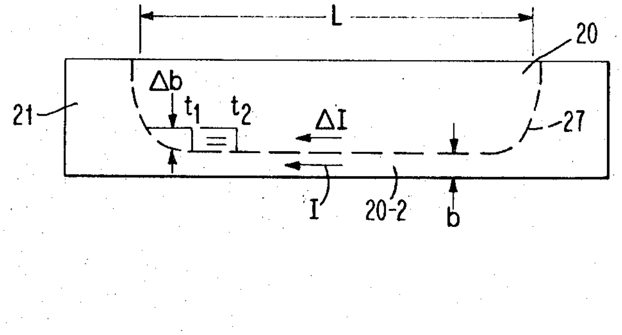
FIG. 2B is a schematic representation of the mechanism of signal propagation in an embodiment according to FIG. 2A.

FIG. 2a shows the structure of a device in accordance with the principles of this invention which exhibits an approximately uniform thickness $d$ of the depletion zone 20 over its whole length $L$. In order to obtain a long delay time, the gate electrode and the depletion zone are considerably extended in the direction of the current flow. For the structure of FIG. 2A, essentially a constant value of $R_o$ can be obtained over the length of the semiconductor current channel. The semiconductor layer is designated 21, the source and drain electrodes are designated 22 and 23, respectively. These electrodes are connected via resistors $R_{20}$ and $R_{21}$ to DC voltage sources $V_{SD}$ for source-drain and $V_{SG}$ for source-gate whose common point 20–1 is grounded. The DC voltages and the semiconductor layer 21 are chosen such that the resistance $R_o$ of the current path is practically infinitely high. The gate electrode is divided into four partial electrodes $G_1$ through $G_4$ designated 24–1, 24–2, 24–3 and 24–4, respectively. Each of these partial electrodes forms a Schottky-barrier contact with the semiconductor channel 21. When the distance between adjacent partial electrodes $G_1$ through $G_4$ is made sufficiently small, a common depletion zone 20 is created in semiconductor channel 21. Its borderline is designated 27. In order to obtain a depletion zone 20 as indicated in FIG. 2B of uniform thickness $d$ and, therefore, uniform thickness $b$ of the semiconductor current channel 20–2, the voltage difference between a partial electrode and the adjacent point semiconductor of the channel must be the same for each partial electrode. Because the current $I_{SD}$ flowing in the semiconductor current channel 20–2 due to the applied DC voltage causes a voltage drop therein, different DC potentials have to be applied to the various partial electrodes $G_1$ through $G_4$. Accordingly, these electrodes are connected via resistors $R_g$ designated 25–1, 25–2, 25–3, respectively, and a DC voltage source $V_{DC}$ is connected across the whole chain $G_1$–$R_{g1}$–$G_2$–$R_{g2}$–$G_3$–$R_{g3}$–$G_4$. This voltage $V_{DC}$ is such that the resulting current $I_{DC}$ causes a voltage drop at each of the resistors $R_g$ which is equal to the voltage drop caused by current $I_{SD}$ in sections of the current channel whose lengths correspond to the distance between two adjacent partial electrodes. Each partial electrode is connected via a corresponding capacitor designated 26–1, 26–2, 26–3, 26–4, to a line 20–3 carrying a fixed DC potential. In the arrangement shown in FIG. 2, this line 20–3 is grounded at connection point 20–1. The capacitors $C_g$ keep each partial electrode at the same AC potential. Voltage source $V_{SG}$ supplies the bias voltage required between source electrode 22 and gate electrode G1.

Electrical signals to be delayed by the embodiment of this invention shown in FIG. 2A are applied as variations in voltage to input terminal 28 and propagate as current waves through the channel semiconductor 21. The delayed unattenuated signals are available as voltage variations at output terminal 29. Resistor $R_{21}$ connected to output terminal 29 serves as load resistor.

The mechanics of the electrical signal propagation within the semiconductor channel 21 are illustrated with the aid of FIG. 2B which shows only the semiconductor channel 21 as well as the depletion zone of FIG. 2A as controlled by the applied DC voltages of FIG. 2A. The arrow designated $I$ indicates the steady current flowing in the current path in the absence of an input signal at input terminal 28. A positive input signal voltage applied to input terminal 28 causes an increase of the steady current $I$ by additional current $\Delta I$. Due to the high channel resistance $R_o$, the additional current $\Delta I$ causes a reduction of the extension of the depletion zone orthogonal to surface 20–4 of semiconductor channel 21, i.e., there is a displacement of charge carriers. The extension of the depletion zone in semiconductor channel 21 is reduced by the value $\Delta b$ and the thickness of the current channel 20–2 is increased by the same amount.

The progressing displacement front of charge carriers is shown in FIG. 2B for points in time $t_1$ and $t_2$. Because the displacement of charge carriers can take place only at drift velocity of the carriers in the semiconductor channel 21, the current variation $\Delta I$, corresponding to the applied signal to be delayed, propagates with the drift velocity $v$, i.e., the entire delay time obtainable with the inventive device is $\tau=(L/v)$, as expressed above in equation (10).

The operation of the inventive delay line as described in the foregoing is based on the condition that the channel resistance $R_o$ is infinitely high, i.e., the second term of equation (9) is precisely zero. If this condition is not met, that part of the transmission corresponding to the second term of equation (9) produces an attenuated signal propagating with a different velocity (corresponding to the RC chain noted above) which may cause a considerable distortion of the output signal.

The following short derivation sets forth the conditions under which a deviation of the value of $R_o$ from infinite becomes critical. Under the condition that capacitance $C_o$ is constant over length $L$ (which is fulfilled for uniform thickness of the depletion zone), equation (9) is converted by a mathematical derivation, into:

$$\Delta I = \Delta I_0 \cdot e - \left(\frac{j\omega}{v} + \frac{\omega^2}{v^3 R_0 C_0}\right)x \qquad (11)$$

with $\omega$ = angular frequency of the signal to be transmitted. The first term of the exponent of equation (11) describes the unattenuated part of the transmitted signal, and the second term describes the attenuated part. The condition that the second term has to be at least approximately zero in order to obtain an unattenuated and undistorted transmission is met as long as the quotient $(\omega^2/v^3R_oC_o)$ remains sufficiently small. With the following typical values:

$v=15^5$ cm./sec., $R_o=10^{+6}$ ohm/cm., $C_o=10^{-7}$ farad/cm., and for $\omega=2\pi\cdot 3\cdot 10^6$, the two terms of the exponent of equation (11) are calculated to be about 190 and about 3.5, respectively. For such a case, an embodiment of the invention is achieved with good quality of the transmission. For lower frequencies $\omega$ a greater deviation of the value of resistance $R_o$ from infinite may be allowed; but for higher frequencies $\omega$ such a deviation becomes more critical.

Figure 3:
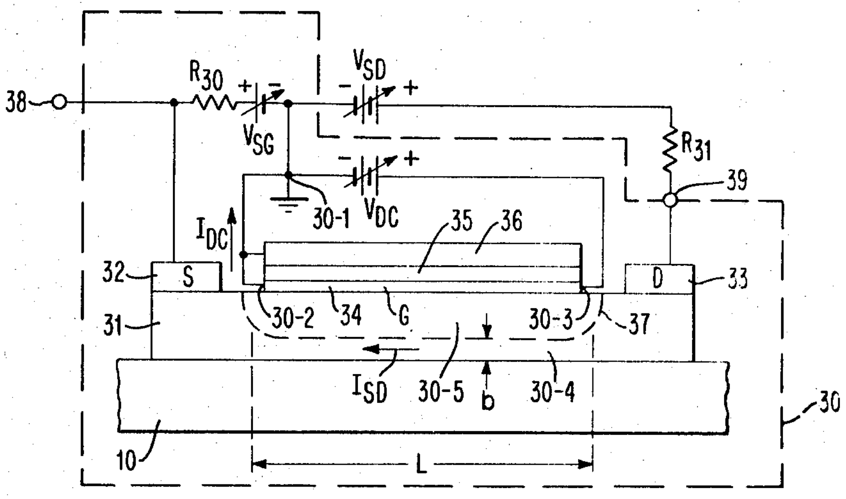
FIG. 3 is a schematic representation of another embodiment of the inventive delay line using a field-effect transistor with Schottky-barrier gate region.

FIG. 3 shows a schematic diagram of another preferred embodiment of the inventive delay line. A semiconductor layer is designated 31, e.g., of the N-conductivity type. It is deposited according to known manufacturing process steps onto a substrate plate 10. The thickness of the semiconductor layer 31 is about 0.2 microns. The semiconductor layer 31 is chosen as thin as possible in order to obtain a narrow current path and thereby a high resistance $R_o$. In the disclosed embodiment of FIG. 3 silicon is used as the semiconductor material for semiconductor layer 31. Advantageously, a semiconductor material is chosen when exhibits a high charge carrier mobility $\mu$ value, i.e., it has a high mobility of the charge carriers. This results in a high drift velocity and the condition that the value of $R_o$ must be close to infinite becomes less critical. Gold-antimony layers are used for the source electrode 32 and drain electrode 33, and form ohmic contacts with the semiconductor material 31. These electrodes are, as shown in FIG. 3, connected to DC voltage sources $V_{SD}$ and $V_{SG}$ via resistors $R_{30}$ and $R_{31}$, respectively, which cause current $I_{SD}$ to flow. Three layers designated 34, 35 and 36 are shown as deposited sequentially on top of semiconductor layer 31. Illustratively, the lowest layer 34 consists of chromium and forms a Schottky-barrier contact with the semiconductor layer 31. The chromium layer is very thin, about 30–50 A., and exhibits a high resistance. Layer 35 consists of $SiO_2$ and forms an insulating layer between chromium layer 34 and conductive metal layer 36, e.g., gold, and is of low resistance and is connected to ground potential at connection point 30–1. The ends 30–2 and 30–3 of high-resistance layer 34 are connected to the terminals of DC voltage source $V_{DC}$. The resulting DC current $I_{DC}$ causes a voltage drop along chromium layer 31, which has an equal value per unit length to that caused by current $I_{SD}$ in the semiconductor current channel 30–4. Therefore, the DC voltage difference between adjacent points of the gate electrode 35 and the semiconductor current channel 30–4, separated by the depletion zone 30–5, is constant over the whole length $L$. This in turn provides for a constant thickness of the depletion zone 30–5 whose lower boundary corresponds approximately to curve 37. The DC voltage source $V_{SG}$ is connected to the source electrode 32 and to the chromium resistance layer 34 which functions as the gate electrode and supplies the required backward bias voltage for the diode formed at the gate electrode-semiconductor contact. Grounded metal conductive layer 36 is capacitively coupled via dielectric layer 35 with gate electrode layer 34 and functions for AC currents as a short circuit electrode and keeps all points of layer 34 at the same AC potential.

The signals to be delayed by the embodiment of FIG. 3A are applied to input terminal 38 and propagate through the semiconductor layer 31 at drift velocity $v$ in accordance with the signal propagation mechanism explained with the aid of FIG. 2B. The signal delayed by time $\tau=(L/v)$ reaches drain electrode 33 and produces a voltage drop across load resistor $R_{31}$ and the output signal is available at terminal 39. Output signals are in phase with the input signals. Illustratively, for a device with a length $L$ of the semiconductor current channel 30–4 (roughly corresponding to the length of the gate electrode 34) of 1 mm., with a charge carrier mobility $\mu$ of 1,000 cm.$^2$/(volt/EC)), and with an applied source-drain voltage $V_{SD}$ of 10 volts, the delay is about 1 microsecond. From the equations $v=\mu\cdot E$ and $\tau=(L/v)$, it is evident that for a given embodiment of this invention with fixed dimensions, a variation of the delay time $\tau$ can be achieved by changing the DC voltage $V_{SD}$ whereby the electrical field strength $E$ is also varied. However, account must be taken that voltage $V_{DC}$ causing the voltage drop in the gate electrode has to be adjusted simultaneously in order to maintain a uniform thickness of the depletion zone over length $L$.

Figure 4:
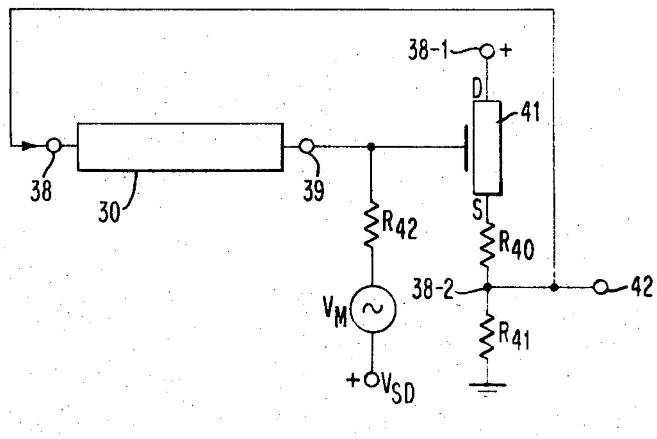
FIG. 4 is an oscillator circuit employing the delay line according to the invention.

FIG. 4 schematically shows an oscillator circuit employing the inventive delay line. The circuitry designated 30 corresponds to that part of the delay line arrangement shown in FIG. 3 surrounded by a dotted line and designated 30. Input and output terminals are indicated as 38 and 39. Output terminal 39 is connected via load resistor $R_{42}$ and a variable voltage source $V_M$ to source-drain voltage source $V_{SD}$ as well as to the gate G of a field-effect transistor 41 which serves as a current amplifier. Positive potential is applied to the drain electrode D of this transistor at terminal 38–1 and its source electrode S is connected to ground via resistors $R_{40}$ and $R_{41}$ forming a voltage divider. The common point 38–2 between these two resistors is connected to input terminal 38 of delay line 30 and is also connected to the oscillator output terminal 42.

The mode of operation of the oscillator of FIG. 4 corresponds essentially to that of prior art circuits in which signals amplified by the transistor 41 are applied to a control electrode of the transistor via a delay line $L$ for initiating a new oscillation period. The oscillation frequency is mainly determined by the delay $\tau$ of circuitry 30 and assumes a fixed value as long as voltage $V_M$ superimposed on source-drain voltage $V_{SD}$ remains constant, e.g., zero.

As mentioned hereinbefore, the delay time $\tau$ of circuitry 30 can be changed by variation of voltage $V_{SD}$. In the oscillator circuit shown in FIG. 4, this can be accomplished by variable voltage source $V_M$ connected between $V_{SD}$ and $R_{42}$. Modulation of the oscillator frequency is achieved with the variation frequency $f_M$ of voltage $V_M$. The delay time $\tau$ and thereby the oscillator frequency depends at any time on the effective source-drain voltage $V_{SD} \pm V_M$. The additional circuitry used to effect the simultaneous change of voltage $V_{DC}$ (see FIG. 3) is not shown in FIG. 4. Such circuitry is in accordance with the conventional practice of the prior art.

The inventive semiconductor solid-state delay line has been described hereinbefore with the aid of preferred embodiments employing a semiconductor device with the essential characteristics of a Schottky-barrier field-effect transistor. However, practice of the invention is not restricted to the embodiments described in the foregoing. Illustratively, the described structure can be replaced by the known metal-oxide-semiconductor (MOS) field-effect transistor devices in which the enhancement zone in the semiconductor layer in the immediate vicinity of the gate electrode forms the current channel whereas the remaining portion semiconductor layer exhibits a very high resistance. The extension of this enhancement zone is similar to the depletion zone in a Schottky-barrier field-effect transistor, and is dependent on the voltage difference between gate electrode and the semiconductor. Therefore, the invention described in connection with a Schottky-barrier device may also be practiced with a structure derived from a metal-oxide-semiconductor field-effect transistor.

While the invention has been particularly shown and described with reference to preferred embodiments thereof it will be understood by those skilled in the art that the foregoing and other changes in form and detail may be made without departing from the spirit and scope of the invention.

What is claimed is:

1. Delay line apparatus for delaying electrical signals comprising:
- a semiconductor channel having a given conductivity type;
- a source electrode means, a gate electrode means and a drain electrode means for establishing a field-effect transistor with said semiconductor channel;
- said gate electrode means including
  - a gate electrode current conductive resistive path proximate to said semiconductor channel for establishing a variable charge carrier depletion zone of approximately uniform thickness in a length therein,
  - a first DC voltage source means connected across said resistive path for establishing a DC current therein and a voltage drop thereacross along said channel, and
  - means for establishing a uniform AC potential along said gate electrode resistive path;
- said source electrode means including
  - a source electrode ohmic contact on said semiconductor channel;
- said drain electrode means including
  - a drain electrode ohmic contact on semiconductor channel, and
  - a second DC voltage source means connected between said source electrode ohmic contact and said drain electrode ohmic contact;
- a signal input terminal means connected to said source electrode ohmic contact and adapted to translate input signals to said semiconductor channel for delay therein; and
- a signal output terminal means connected to said drain electrode ohmic contact and adapted to translate said delayed input signals from said semiconductor channel.

2. Delay line apparatus as set forth in claim 1 wherein said source electrode means includes a third DC voltage source means connected between said source electrode ohmic path and said gate electrode resistive path.

3. Delay line apparatus as set forth in claim 1 wherein said semiconductor channel is of N-type silicon.

4. Delay line apparatus as set forth in claim 1 wherein said resistive path of said gate electrode means establishes a Schottky-barrier junction with said semiconductor channel.

5. Delay line apparatus as set forth in claim 1 wherein said depletion zone is of approximately uniform thickness along said length of said semiconductor channel whereby a current channel of approximately uniform thickness is established in said semiconductor channel for delaying said input signals.

6. Delay line as set forth in claim 1 wherein said resistive path includes:
- a first plurality of partial gate electrodes; and
- a second plurality of resistances connecting sequentially said partial gate electrodes.

7. Delay line apparatus as set forth in claim 6 wherein said means for establishing said uniform AC potential along said resistive path includes a source of AC potential, and a first plurality of capacitances connected respectively to said first plurality of partial gate electrodes and to said source of said AC potential.

8. Delay line apparatus as set forth in claim 1 wherein said resistive path includes a continuous layer of resistive material.

9. Delay line apparatus as set forth in claim 8 wherein said continuous layer of resistive material consists of chromium.

10. Delay line apparatus as set forth in claim 8 wherein said means for establishing said uniform AC potential along said resistive path of said gate electrode means includes a source of AC potential an insulator layer on said layer of resistive material and a conductive layer on said insulator layer connected to said source of said AC potential.

* * * * *